US006365457B1

(12) United States Patent
Choi

(10) Patent No.: US 6,365,457 B1
(45) Date of Patent: *Apr. 2, 2002

(54) METHOD FOR MANUFACTURING NONVOLATILE MEMORY DEVICE USING SELF-ALIGNED SOURCE PROCESS

(75) Inventor: Jeong-Hyuk Choi, Kyonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

This patent is subject to a terminal disclaimer.

(21) Appl. No.: 09/275,809

(22) Filed: Mar. 25, 1999

(30) Foreign Application Priority Data

Mar. 26, 1998 (KR) .............................. 98-10517

(51) Int. Cl.$^7$ .......................................... H01L 21/336
(52) U.S. Cl. ........................ 438/258; 438/264; 438/297
(58) Field of Search ................. 438/258, 264, 438/297, FOR 203

(56) References Cited

U.S. PATENT DOCUMENTS 5,506,159 A * 4/1996 Enomoto
5,789,294 A * 8/1998 Choi
5,792,696 A * 8/1998 Kim et al.

* cited by examiner

*Primary Examiner*—George Fourson
*Assistant Examiner*—Michelle Estrada
(74) *Attorney, Agent, or Firm*—Volentine Francos, PLLC

(57) ABSTRACT

There is provided a method for manufacturing a nonvolatile memory device using a self-aligned source (SAS) process. The method has the steps of forming a field oxide film on a semiconductor substrate, thus defining an active region on the substrate; sequentially forming a tunnel oxide film, the first conductive layer, an interpoly dielectric layer and the second conductive layer on the substrate; forming a stacked gate of the first and second conductive layers on the active region; forming source/drain regions of first concentration by ion-implanting first impurity on the active region exposed by the stacked gate; removing the exposed field oxide film by using the word line as an etching mask; and exposing the source region of each cell and a portion of the word line and ion-implanting second impurity by using the exposed word line as a mask. The present invention does not need an additional mask for SAS process because the SAS etching is processed by using the mask for forming a stacked gate of a memory cell array and can secure sufficient process margin in a bit line contact region.

14 Claims, 19 Drawing Sheets

METHOD FOR MANUFACTURING NONVOLATILE MEMORY DEVICE USING SELF-ALIGNED SOURCE PROCESS

This application relies for priority upon Korean Patent Application No. 98-10517, filed on Mar. 26, 1998, the contents of which are herein incorporated by reference in their entirety.

BACKGROUND OF THE INVENTION

The present invention relates to a method for manufacturing a nonvolatile memory device. More particularly, the present invention relates to a method for manufacturing a NOR flash memory device having a stacked gate structure of a floating gate and a control gate.

Semiconductor memory devices are largely divided into Random Access Memories (RAMs), such as Dynamic RAMs (DRAMs) and Static RAMs (SRAMs), and Read Only Memories (ROMs), including Programmable ROMs (PROMs), (Erasable PROMs (EPROMs), and Electrically Erasable PROMs (EEPROMs). RAMs are referred to as volatile memories in that data contained in them is destroyed with the passage of time. In contrast, ROMS are non-volatile memory and retain data once it is entered. Among such ROMs, demands for EEPROMs (Electrically Erasable and Programmable ROMs) are increasing. The EEPROM cells, or the flash memory cells, have a stacked gate structure including a floating gate and a control gate.

Flash memory cells are divided into a NOR type and a NAND type. In the NAND type, which is useful for realizing high integration, unit strings, each containing n cells connected in series, are connected in parallel between bit lines and ground lines. In the NOR type, which allows high-speed operation, individual cells are connected in parallel between bit lines and ground lines.

A description of the structure and operation of a basic NOR flash memory cell, disclosed in IEDM'85, pp. 616~619, "A Single Transistor EPROM Cell And Its Implementation In A 512K CMOS EEPROM", will be given below with reference to FIGS. 1 to 3.

FIG. 1 is a partial layout diagram of a memory cell array in a conventional NOR flash memory device, FIG. 2 is an equivalent circuit diagram of the memory cell array of FIG. 1, and FIG. 3 is a cross-sectional view of a unit cell. Reference numeral 10 denotes a semiconductor substrate; reference numeral 11 denotes an active source region; reference no numeral 14 denotes a tunnel oxide film; reference numeral 16 denotes a floating gate; reference numeral 18 denotes an interpoly dielectric layer; reference numeral 20 denotes a control gate, reference numerals 24a and 24b denote source and drain regions, respectively; and reference numeral 28 denotes a bit line contact.

Referring to FIGS. 1 to 3, a memory cell array has a plurality of bit lines B/L arranged at specified intervals, a plurality of word lines W/L and a plurality of source lines CSL. A unit cell in the array contains a stacked gate structure including the floating gate 16 and the control gate 20. Each unit cell is formed in an area where the word line W/L perpendicularly intersects one of the metal bit lines B/L. Two individual cells are connected to the bit line B/L by a single bit line contact 28, and the active source region 11 formed of an impurity layer and disposed in parallel with the word line W/L, is connected by the source line CSL arranged in parallel with the bit line B/L for tens of bits.

In a unit cell, the he tunnel oxide film 14 is interposed between the floating gate 16 and the substrate 10, and the interpoly dielectric layer 18 is interposed between the floating gate 16 and the control gate 20. The source and drain regions 24a and 24b are formed in the surface of the substrate 10 in self-alignment with the stacked gate. The floating gate 16 extends across an active region and portions of the edges of field regions at both sides of the active region, thus being isolated from that of an adjacent cell. The control gate 20 is connected to that of an adjacent cell, thus forming a word line W/L.

Adjacent cells are formed in opposite directions, sharing the source/drain regions 24a and 24b. The drain region 24b of a unit cell is connected to that of an adjacent cell in the same row, and has the bit line contact 28 formed therein. Bit line contacts 28 in the same row are electrically connected by the bit line B/L perpendicular to the word line W/L. That is, two cells are connected to the bit line B/L by a single bit line contact 28.

The source region 24a of the unit cell is connected to that of an adjacent cell in the same column through the active source region 11 formed of an impurity diffusion layer parallel to the word line W/L. In addition, to reduce the resistance of the source line, a single source line contact is formed in the active source region 11 parallel to the word line W/L, for a plurality of bit lines B/L. The source line CSL parallel to the bit line B/L is electrically connected to the active source region 11 through the source line contact 29.

Such a general NOR flash memory cell is programmed by CHE (channel hot electron) injection and erased through a source or a bulk substrate by Fowler-Nordheim tunneling (F-N tunneling).

For a programming operation, the threshold voltage $V_{th}$ of a cell is increased from an initial level of about 2V, to about 7V by storing electrons on the floating gate 16. In other words, by applying 6~7V to the selected bit line B/L, 10~12V to the selected word line W/L, and 0V to the source and the bulk substrate, parts of the CHEs are introduced onto the floating gate 16 via the tunnel oxide film 18 by a gate electric field. In this way, the cell is programmed.

For an erasing operation, the threshold voltage $V_{th}$ of the cell is dropped to the initial level, i.e., about 2V, by removing electrons from the floating gate 16. In other words, by floating the selected bit line B/L and applying 12~15V to the source and 0V to the selected word line W/L, the electrons are removed from the floating gate 16 to the source junction via the tunnel oxide film 18 of about 100 Å by Fowler-Nordheim tunneling, due to a potential difference between the floating gate 16 and the source junction. Typically, since the source junctions of all cells are electrically connected to one by the active source region 11, cells are collectively erased in block units each block being hundreds to thousands of bits. Furthers since the source voltage during the erasing operation is higher than the drain voltage during the programming operation, the source junction is formed to be a double diffused junction (hereinafter referred to as a "DD") structure as shown in FIG. 3 so as to make the source junction have higher breakdown voltage than the drain junction.

A reading operation determines the presence or absence of a current path through erased and programmed cells by applying about 1V to the selected bit line B/L and 4~5V to the word line W/L.

The source line CSL serves to discharge to a ground node the great amounts of current generated by the cells during programming and reading operations. To discharge large amount of current in a short time in the flash memory cell using CHE injection, one source line CSL is formed for every 16~32 bits.

During the programming and erasing operations, the F-N tunneling characteristics or the hot electron generation efficiency may be varied according to the dimension of the cell. In particular if the cell size is reduced, as it is with highly integrated devices, the loss of efficiency can become serious. For example, in the case of a cell having a short channel length, the punching characteristics between the source and the drain become degraded, while the hot electron generation efficiency is increased by the increase of cell current during a programming operation, thus allowing short programming time. Furthermore, when the overlap area between the source junction and the floating gate is increased during the source erasing operation, the voltage $V_f$ induced at the floating gate when a source voltage $V_s$ is applied is given by $$V_f = (C_s/C_t)V_s \tag{1}$$

where $C_s$ is an overlap capacitance between the source junction and the floating gate and $C_t$ is a total capacitance, i.e., "$C_s + C_b + C_f$" where $C_b$ is an overlap capacitance between a bulk substrate and the floating gate, and $C_f$ is an overlap capacitance between the floating gate and the control gate. Hence, if $C_s$ is increased, $V_f$ is also increased and thus the electric field between both ends of the tunnel oxide film required in F-N tunneling is decreased, resulting in an increase in the required erasing time.

FIG. 4 is a layout diagram showing a misalignment between the active source region and the word line in the above-described conventional NOR flash memory device. FIGS. 5A and 5B are sectional views of the conventional NOR flash memory cell, taken along lines A1–A1' and A2–A2' of FIG. 4, respectively.

In the conventional NOR flash memory device as described above, the active source region 11 is formed in the form of "⊥" so as to be connected to an adjacent cell, as can be seen from the layout of FIG. 1. If a misalignment occurs between the word line and the active source region 11 when patterning the word line 20 as shown by b of FIG. 4, the overlap area between the source junction 24a and the floating gate 16 in a specific cell is increased as shown in FIG. 5B and thereby the overlap capacitance between the source junction 24a and the floating gate 16 is also increased. To prevent this problem, the distance between the active source region 11 and the word line 20 should be increased as shown in FIG. 1. However, the increase in distance between the active source region 11 and the word line 20 causes a corresponding increase in cell size, making such a layout is inadequate for the highly integrated memory cells.

A method for improving this problem is disclosed in U.S. Pat. No. 5,470,773 FIG. 6 shows a layout of a memory cell array of the NOR flash memory device according to this method. In FIG. 6, reference numeral 51 denotes an active region, reference numeral 56 denotes a floating gate, reference numeral 58 denotes a control gate and reference numeral 72 denotes a bit line contact.

Referring now to FIG. 6, since the active region 51 is arranged to be a straight line parallel to the bit line B/L, the source regions of adjacent cells in the word line direction cannot be connected to each other. Hence, after opening the region "B" of FIG. 6 by photolithography, the field oxide film formed on the region B is etched, the exposed substrate is implanted with impurity, the implanted impurity is diffused by a thermal process, thereby forming an impurity diffusion region which is connected to the source region of an adjacent cell, to achieve a common source region. The common source region formed in this way is not changed by the change of the mask pattern process and is self-aligned to the word line. Hence, this process is typically called a self-aligned source process ("SAS process").

FIGS. 7A to 8B are sectional views for explaining a method for fabricating the NOR flash memory device as described above. Here, FIGS. 7A and 8A are sectional views taken along line c–c' of FIG. 6, while FIGS. 7B and 8B are sectional views taken along line d–d' of FIG. 6.

Referring to FIGS. 7A and 7B, the field oxide film 52 is formed over the semiconductor substrate 50 by an isolation process such as a local oxidation of silicon ("LOCOS") process, thus dividing the substrate 50 into an active region and a field region. Subsequently, a tunnel oxide film 54 is formed over the active region of the substrate 50 and a first polysilicon layer 56 acting as a floating gate is deposited thereon. Next, the first polysilicon layer 56 on the field oxide film 52 is etched by photolithography, thus separating the floating gate of each cell in the bit line direction. An ONO (oxide/nitride/oxide) layer 58 as an interpoly dielectric layer is formed over the resultant structure and a second polysilicon layer 60 acting as a control gate and an oxide film 62 are sequentially deposited thereon. Subsequently, a photoresist pattern (not shown) for forming word lines is formed over the oxide film 62, and thereafter, the oxide film 62, the second polysilicon layer 60, the ONO layer 58 and the first polysilicon layer 56 are sequentially etched using the photoresist pattern as an etching mask, thus forming a stacked gate. Here, the oxide film 62 serves to prevent the word line 60 from being damaged by dry etcher while removing the exposed field oxide film 52 in a subsequent SAS process.

To perform the SAS process, after forming a photoresist pattern 63 to open the region where the common source region is to be formed, the field oxide film 52 of the opened region is etched using the photoresist pattern 63 as an etching mask. The opened region is self-aligned to the word line 60. Subsequently, $n^+$ impurity 64 is ion-implanted by using the photoresist pattern 63 as an ion-implantation mask. The ion-implanted $n^+$ impurity 64 is diffused by a subsequent thermal process, thus being provided as a common source region connecting the source regions of adjacent cells in the word line direction.

Referring to FIGS. 8A and 8B, after removing the photoresist pattern 63, an $^-$ impurity is ion-implanted by using a mask (not shown) to open a high voltage transistor region in a peripheral circuit region for driving cells. In this case, the source region of the cell is also opened to be ion-implanted by the $^-$ impurity. Next, $n^+$ impurity is ion-implanted to form an NMOS transistor at the peripheral circuit region for driving cells, thus forming the source/drain regions (not shown) of the NMOS transistor. In this case, the cell region is also opened to be ion-implanted by the $n^+$ impurity. As a result, the source region of the cell is formed to be a DD structure of the $^-$ junction and the $n^+$ junction, while the drain region of the cell is formed of only the $n^+$ junction. Here, by ion-implanting $^-$ impurities into the source region of the opened cell during the SAS process, the mask used for making the source region be a DD junction structure may be omitted in a subsequent process. In this case, however, the peripheral circuit region should generate a high voltage of about 12V to be induced to the cell region and provide the high voltage to the source region of the cell requiring this high voltage at a necessary time by a selective switching, and thus the transistor of the peripheral circuit region should be formed to be a junction structure which can endure the high voltage of about 12V. Hence, the typical way of operating this is to open the source region of the cell as well as the high voltage transistor region of the peripheral circuit region after the SAS process and then to ion-implant ⁻ impurity onto the opened source region and high voltage transistor region. Furthermore, to solve the problem that the number of processes in a fabrication method is increased by the SAS process and the ⁻ impurity ion-implantation process, a method may be used which forms the source region of the cell to be an n⁺ junction structure like the drain region and then removes the high voltage path by lowering the voltage applied to the source region to about 5V and applying a negative voltage to the gate during the erasing operation.

Subsequently, a high temperature oxide (HTO) film 68 and a BPSG (boro-phosphor silicate glass) layer 70 are sequentially deposited over the resultant structure and then the BPSG layer 70 is planarized by a reflow process. The layers deposited over the drain region 66b of the cell are removed by wet and dry etching processes, thus forming a bit line contact 72. A metal layer is deposited over the resultant structure and patterned by a photolithography, thus forming a bit line 74 which is electrically connected to the drain region 66b of the cell via the bit line contact 72.

The conventional method as described above has a problem that an additional mask (reference numeral 63 in FIGS. 7A and 7B) is added to perform the SAS process. Furthermore, all of the oxide film 62 of the exposed region are removed and only the oxide film 62 of the unexposed region close to the bit line contact 72 remains. Because the wet etching should be performed first to improve the contact profile in a subsequent contact process, the distance e between the HTO layer 68 under the BPSG layer 70 and the bit line 74 is reduced. Furthermore, if the HTO layer 68 is exposed in the wet etching process, the HTO layer 68 may then be etched rapidly due to its high wet etching rate and the insulating capability between the word line 60 and the bit line 74 may be degraded, thus causing a malfunction during the cell operation. Therefore, it is necessary to secure a specific distance between the HTO layer 68 and the bit line 74. However, this leads to an increase in the design rule by the thickness of the oxide film 62 formed on the word line 60, thus limiting the reduction in cell size.

SUMMARY OF THE INVENTION

Accordingly, an object of the present invention is to provide a method for manufacturing a nonvolatile memory device using an SAS process that can secure a process margin at a bit line contact region without the use of an additional mask, to solve the problems depicted above.

To achieve the above object, a nonvolatile memory device is provided, comprising: a memory cell array having a plurality of cells, each cell including a stacked gate, a source region, and a drain region formed over a substrate in the vicinity of the stacked gate, wherein the stacked gate includes a floating gate, a control gate, and an interdielectric layer interposed between the floating gate and the control gate, a word line provided in a row to connect the control gates of the cells, a common source region formed in the substrate in parallel with the word line to connect the source regions of the cells, and a field insulating layer formed between the cells, having side edges formed in a self-alignment manner with side edges of the word line. Preferably, the field insulating layer is not formed in an area between the drain regions of the cells.

To achieve the above object, there is also provided a method for manufacturing a nonvolatile memory device comprising a memory cell array having a plurality of cells, the method comprising forming a field oxide film over a semiconductor substrate to define an active region of the substrate, sequentially forming a tunnel oxide film, a first conductive layer, an interpoly dielectric layer, a second conductive layer, and a first insulating layer over the substrate, forming a stacked gate of the first and second conductive layers over the active region, forming source/drain regions of a first concentration by ion-implanting a first impurity in a portion of the active region exposed by the stacked gate, removing an exposed portion of the field oxide film using the second conductive layer as an etching mask, and exposing the source region of each cell and a portion of the second conductive layer, and ion-implanting second impurity using the exposed second conductive layer as a mask.

In this method, the second conducting layer may be used as a word line. Preferably all of the first insulating layer is etched in the step of removing the exposed field oxide film. The first insulating layer preferably remains over the whole of the second conductive layer and maintains a uniform thickness after the step of removing the exposed field oxide film.

To achieve the above object, there is provided yet another method for manufacturing a nonvolatile memory device comprising a memory cell array having a plurality of cells, each cell including a stacked gate structure having a first conductive layer and a second conductive layer, and a peripheral circuit region for driving the cells, the method comprising: forming a field oxide film over a semiconductor substrate to define an active region of the substrate, sequentially forming a tunnel oxide film, the first conductive layer, an interpoly dielectric layer, the second conductive layer and a first insulating layer over the substrate, forming a single-layer gate comprising the second conductive layer over the active region of the peripheral circuit region, forming a stacked gate of the first and second conductive layers over the active region of the memory cell array, forming source/drain regions of the cell at a first concentration by ion-implanting a first impurity in a portion of the active region of the memory cell array that is exposed by the stacked gate, removing an exposed portion of the field oxide film using the second At conductive layer as an etching mask, and exposing the source region of each cell in the memory cell array and an active region of the peripheral circuit region and ion-implanting a second impurity in the exposed source regions.

The second conducting layer may be used as a word line. Preferably the steps of forming a stacked gate, forming source/drain regions of the cell at a first concentration, and removing an exposed portion of the field oxide film are all processed using a single photo mask.

The step of sequentially forming a tunnel oxide film, the first conductive layer, an interpoly dielectric layer, the second conductive layer and a first insulating layer over the substrate, may further comprises isolating the first conductive layer of each cell by exposing a portion of the field oxide film between the active regions of the memory cell array and etching the first conductive layer, the isolating being performed before forming the interpoly dielectric layer over the first conductive layer. The step of sequentially forming a tunnel oxide film, the first conductive layer, an interpoly dielectric layer, the second conductive layer and a first insulating layer over the substrate, may also comprise removing the interpoly dielectric layer and the first conductive layer in the peripheral circuit region, and forming a gate oxide film over the active region of the peripheral circuit region, before forming the second conductive layer over the interpoly dielectric layer.

Preferably all portions of the first insulating layer are etched in the step of removing the exposed oxide film. Also, the first insulating layer preferably remains over the whole of the second conductive layer and maintains a uniform thickness after the step of removing the exposed oxide film.

This method may further comprise forming an impurity region of a second concentration lower than the first concentration by exposing the source region of the cell and ion-implanting a third impurity into the exposed source region of the cell. This may be done either before or after the step of exposing the source region of each cell in the memory cell array and an active region of the peripheral circuit region and ion-implanting a second impurity in the exposed source regions. Preferably, a region where a high voltage device is to be formed in the peripheral circuit region is also exposed when exposing the source region of the cell.

As described above, the present invention does not need an additional mask for SAS process because the SAS process is performed by using the mask for forming the stacked gate of the memory cell array. Furthermore, this makes it possible to secure sufficient process margin in the bit line contact region, since all portions of the first insulating layer on the word line are removed or remain while maintaining a uniform thickness after the SAS etching process.

BRIEF DESCRIPTION OF THE DRAWINGS

The foregoing and other objects, features and advantages of the present invention will become more apparent from the following detailed description when taken in conjunction with the accompanying drawings in which.

DETAILED DESCRIPTION OF THE PREFERRED EMBODIMENT

Reference will now be made in detail to the preferred embodiment of the present invention.

Figure 9:
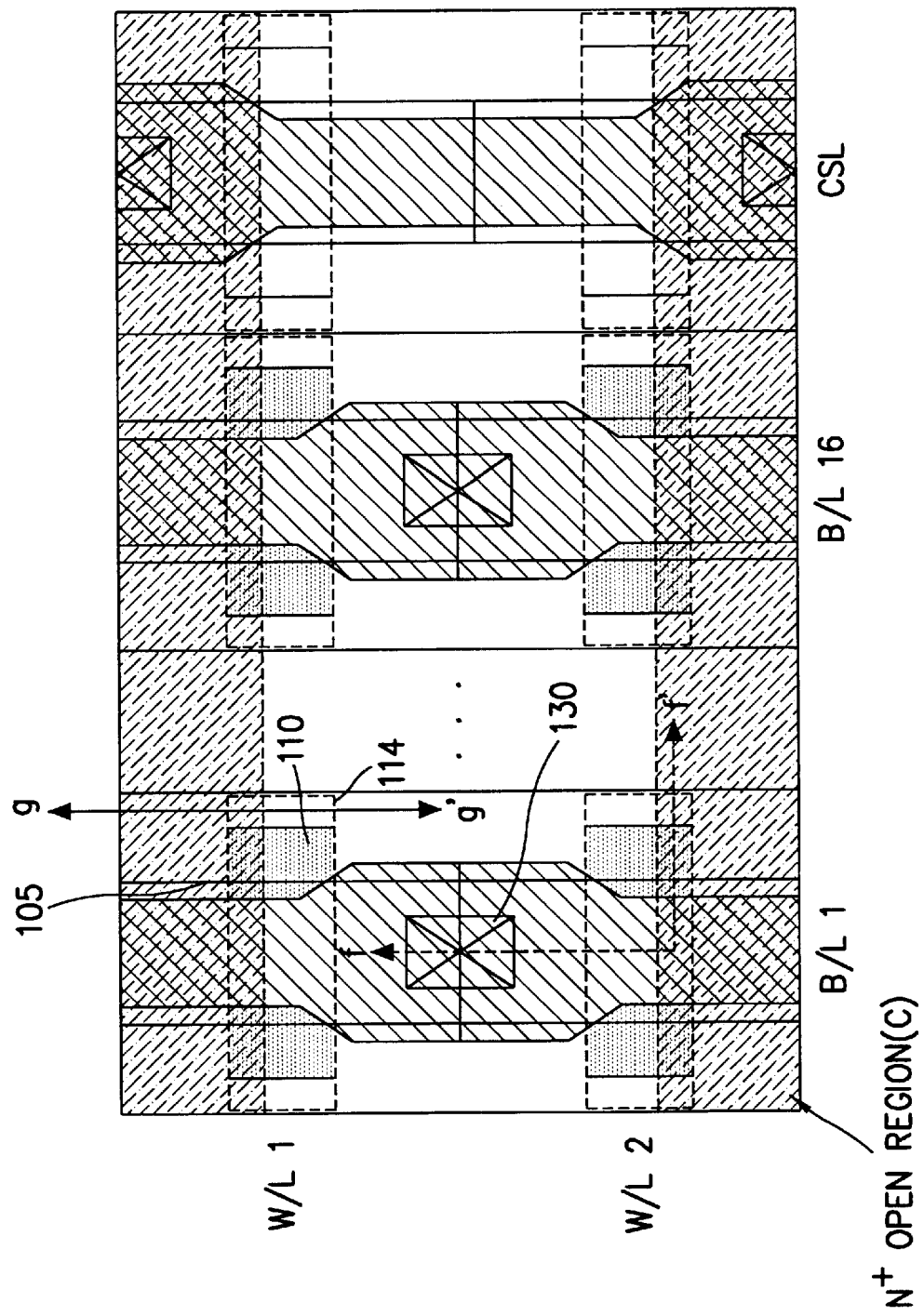
FIG. 9 is a partial layout diagram of a memory cell array in a NOR nonvolatile memory device according to a preferred embodiment of the present invention.

FIG. 9 is a partial layout diagram of a memory cell array is described of a NOR flash memory device according to a preferred embodiment of the present invention.

Referring to FIG. 9, memory cell array is provided having a plurality of bit lines B/L arranged at specified intervals, a plurality of word lines W/L and a plurality of source lines CSL. The memory cell array includes individual unit cells, each having a stacked gate structure including a floating gate 110 and a control gate 114. The unit calls are formed in an area where the word line W/L perpendicularly intersects the metal bit line B/L. Two cells are connected to each bit line B/L via a single bit line contact 130.

Furthermore, since active regions 105 are arranged to be a straight line that is parallel to the bit line B/L in the memory cell array of the present invention, a common source region (defined by "C" of FIG. 9) is formed by an SAS process to connect the source regions of adjacent cells in the word line direction. A source line contact is formed at the common source region, for a plurality of bit lines B/L. The source line CSL is arranged parallel to the bit line B/L and is electrically connected to the common source region via the source line contact.

FIGS. 10 to 17 are sectional views for explaining a method for manufacturing a NOR flash memory device according to a preferred embodiment of the present invention, taken along line f–f' of FIG. 9.

Figure 10:
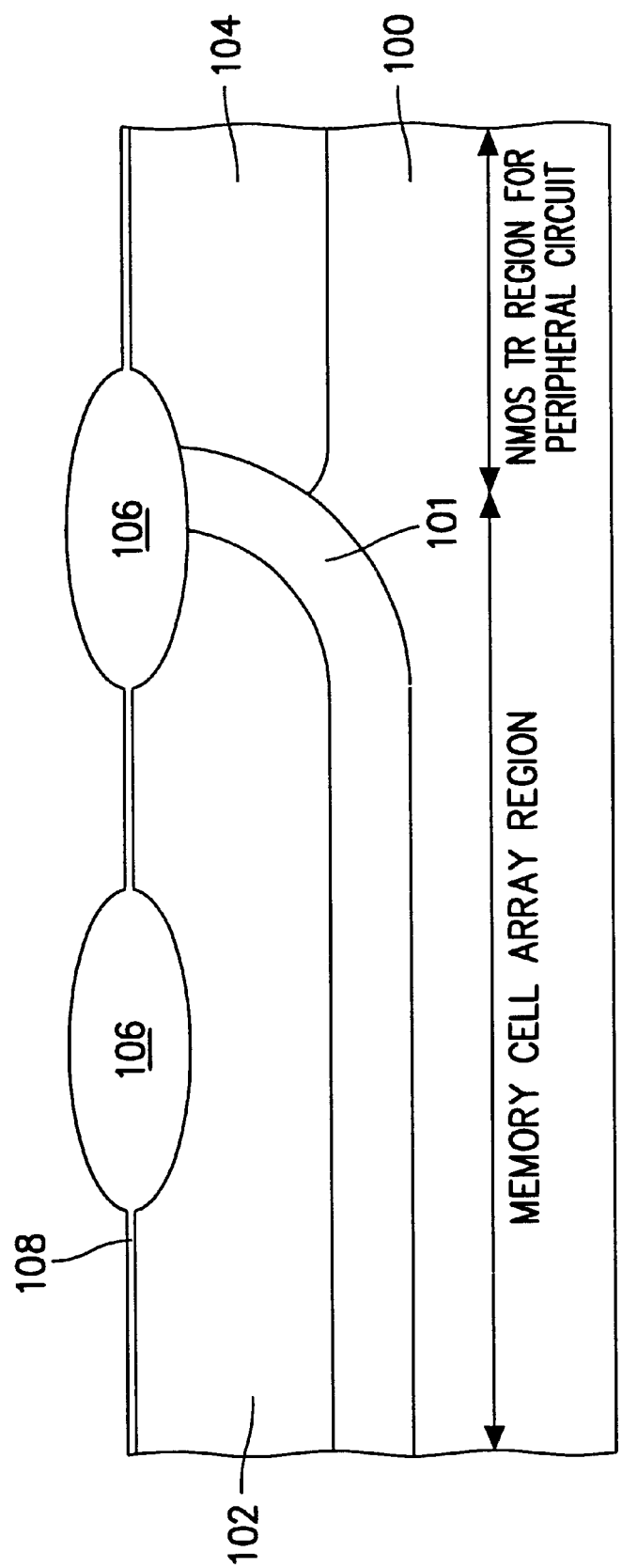
FIGS. 10 to 17 are sectional views for explaining a method for manufacturing a NOR flash memory device according to a preferred embodiment of the present invention, taken along line f–f' of FIG. 9.

Referring to FIG. 10, what is shown is the step of forming wells and a field oxide film 106. First, an n-type impurity is ion-implanted in the surface of a p-type semiconductor substrate 100 by photolithography and ion-implantation and is diffused to a desired depth by a high temperature heat treatment, thereby forming an n-type well 101. Subsequently, a p-type impurity is ion-implanted in the surface of the substrate except for the n type well 101 and in the memory cell array region in the n type well 101 by photolithography and ion-implantation. The p-type impurity is then diffused by a high temperature heat treatment, thus forming p-type wells 102 and 104. Typically, a well where an NMOS transistor in the peripheral circuit region is to be formed is called a p-type well 104, while a well which is to be formed at the memory cell array region in the n-type well 101 is called a pocket p-well 102.

After forming the wells 101, 102 and 104, a field oxide film 106 is formed on top of the substrate 100 to a thickness of about 4000 Å by a general device isolation process, for example, LOCOS(Local Oxidation of Silicon) or polysilicon buffered LOCOS (PBL), thereby defining an active region and a field region in the substrate 100. After the formation of the field oxide film 106, a sacrificial oxide film is formed over the substrate 100 and is then removed by wet etching to remove unintended films at the interface between the active region and the field region.

A tunnel oxide film 108 is formed over the substrate 100 by growing an oxide film or an oxynitride film on top of the active region to a thickness of about 100 Å. In this case, the step of defining the cell region by a photolithography and ion-implanting p-type impurity, e.g., boron or $BF_2$ with an energy of 50 keV at a dose of $1.5{\sim}2.5{\times}10^{13}$ ion/cm$^2$, may be added after forming the field oxide film 106, to control the threshold voltage of the cell.

Figure 11:
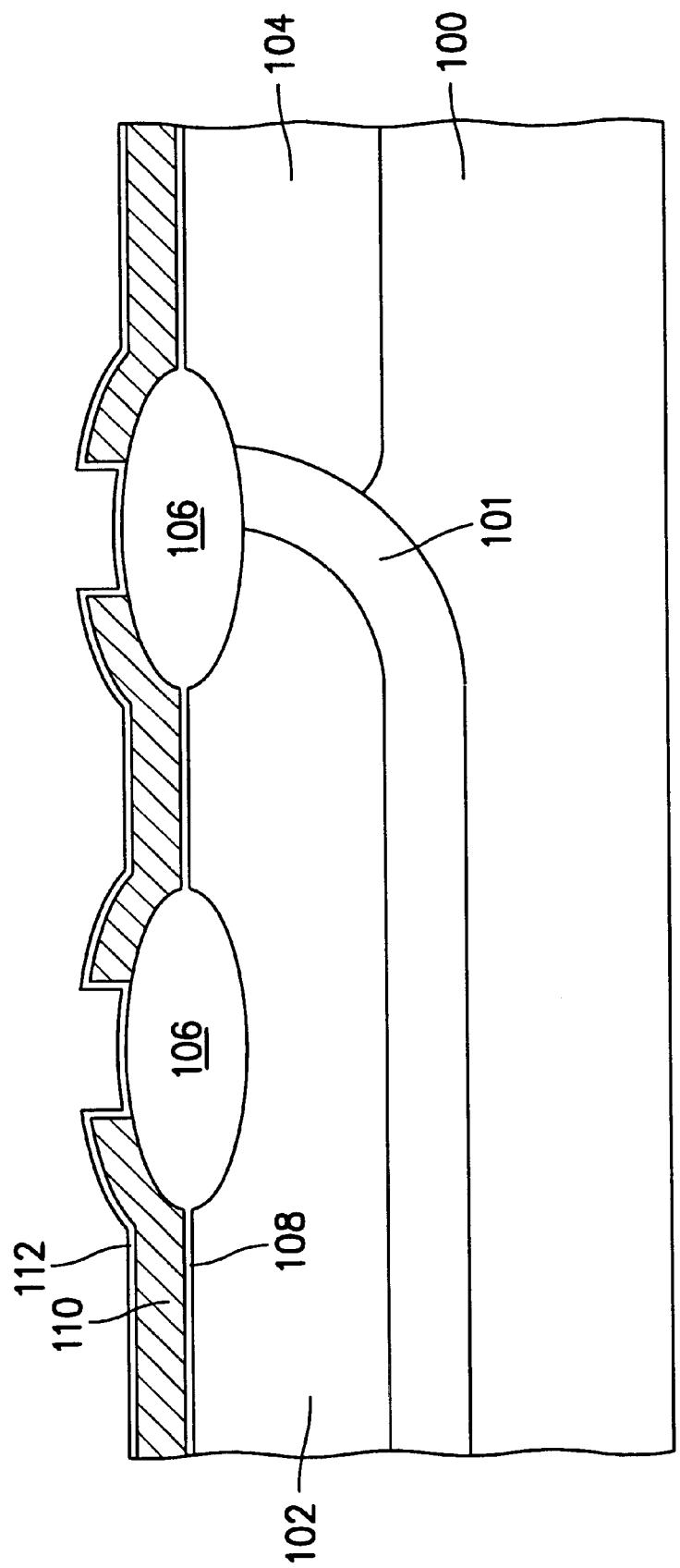

FIG. 11 shows the step of forming a first conductive layer 110 and an interpoly dielectric layer 112. After forming the tunnel oxide film 108 as described above, the first conductive layer 110 to be used as a floating gate is doped to be of an n$^+$-type by depositing, for example, polysilicon over the resultant structure to a thickness of about 1000 Å by chemical vapor deposition (CVD) and then depositing phosphorous-rich POCL$_3$ in it. Then, floating gates of adjacent cells along the bit line are isolated from each other by removing the first conductive layer 110 on the field oxide film 106 of the cell region by dry etching. In other words, the first conductive layer 110 for the floating gate is formed to be a pattern covering the active region and a portion of the field oxide film 106 and is removed from a portion of the field oxide film 106, extending in the bit line direction, as shown in FIG. 9. When etching the first conductive layer 110 as described above, the first conductive layer 110 in the peripheral circuit region is not etched by a photoresist pattern (not shown) or all portions of the first conductive layer 110 in the peripheral circuit region are removed.

To isolate the floating gate from a control gate, for example, an ONO (Oxide/Nitride/Oxide) film is formed as the interpoly dielectric layer 112 over the resultant structure. The ONO film 112 is formed to a thickness of about 130~200 Å, by growing a first oxide film to a thickness of about 100 Å by oxidation of the first conductive layer 110; depositing a nitride film on the first oxide film to a thickness of about 130 Å; oxidizing the nitride film; and thus growing a second oxide film to a thickness of about 40 Å.

Figure 12:
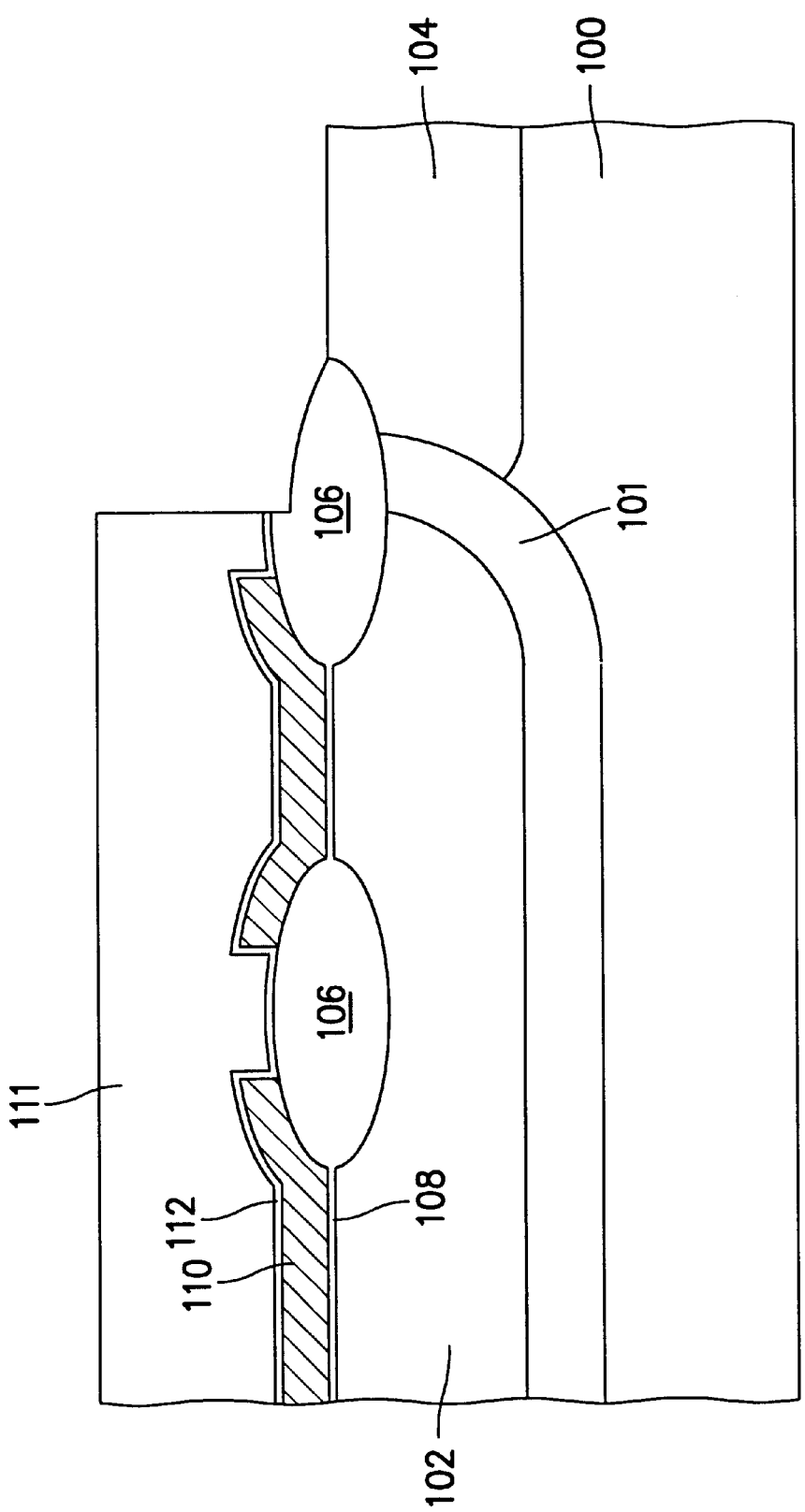

FIG. 12 shows the step of removing the interpoly dielectric layer 112 and the first conductive layer 110 in the peripheral circuit region. After forming the interpoly dielectric layer 112 as described above, a photoresist pattern 111 is formed by photolithography, to open only the peripheral circuit region. The interpoly dielectric layer 112 and the first conductive layer 110 of the exposed peripheral circuit region are then sequentially removed by dry etching. The remaining insulating layer, i.e., the tunnel oxide film 108 is removed by wet etching, in consideration of the damage of the substrate 100. In this case, if the first conductive layer 110 of the peripheral circuit region has already been removed in the step of FIG. 11, the tunnel oxide film 108 is also removed when removing the interpoly dielectric layer 112.

Figure 13:
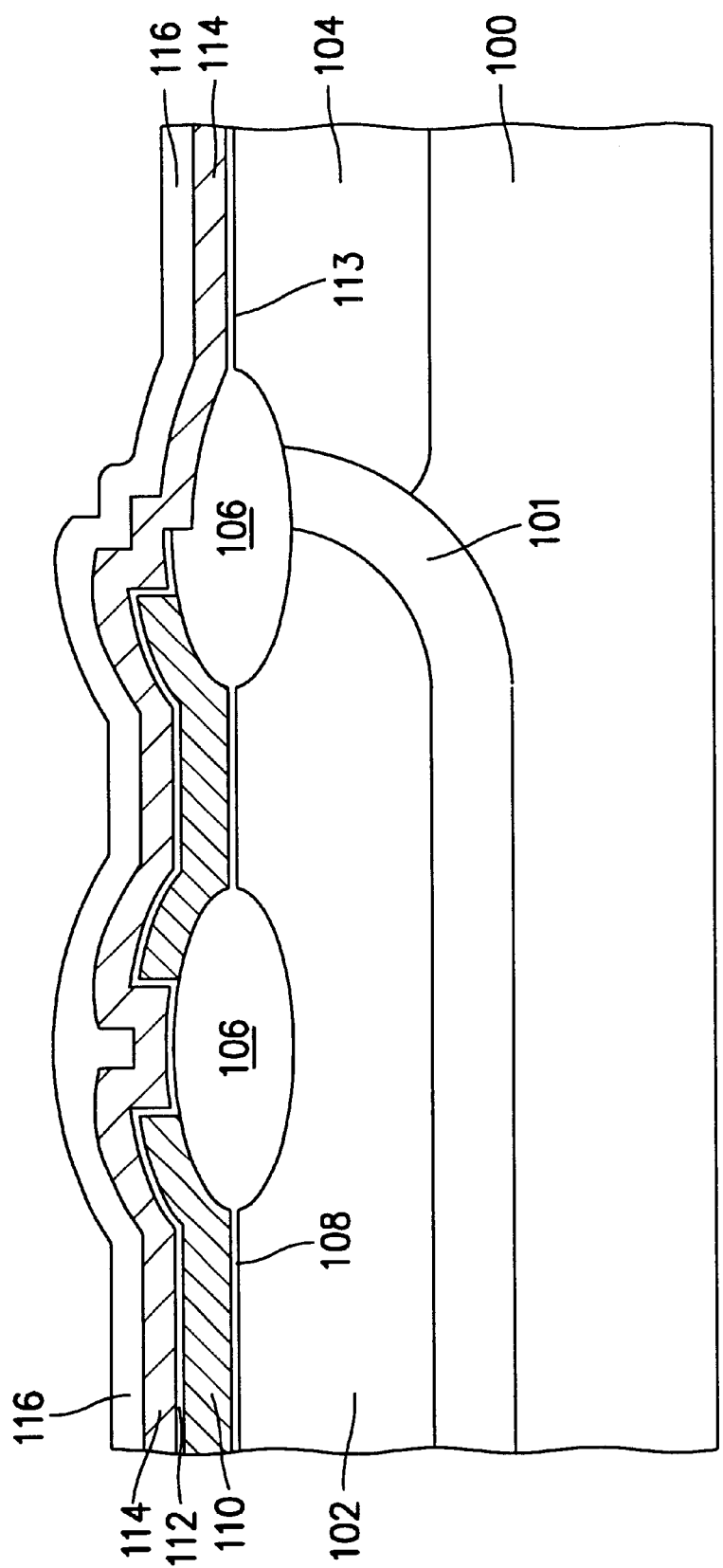

FIG. 13 shows the step of forming a gate oxide film 113, a second conductive layer 114, and a first insulating layer 116. After removing the interpoly dielectric layer 112, the first conductive layer 110, and the tunnel oxide film 108 of the peripheral circuit region as described above. The photoresist pattern 111 is removed. An oxide film is then grown onto the active region of the exposed peripheral circuit region by thermal oxidation, thus forming a gate oxide film 113 over the active region where a peripheral circuit transistor is to be formed. The thickness of the gate oxide film 113 is preferably determined in accordance with the driving capability of the peripheral circuit transistor. In other words, if the operating voltage of the peripheral circuit transistor is less than 5V, the gate oxide film 113 is formed to a thickness of about 100~160 Å, and if the operating voltage is over 10V, it is formed to a thickness of about 200~400 Å.

Subsequently, a polycide layer is formed as the second conductive layer 114 to be used as the control gate on the resultant structure by sequentially depositing, for example, an n$^+$-doped polysilicon layer and a metal silicide layer such as tungsten silicide (WSi$_x$), titanium silicide (TiSi$_x$), and tantalum silicide (TaSi$_x$). Preferably the polysilicon layer and the metal silicide layer are formed to be about 1000 Å and 1500 Å thick, respectively, by a CVD process. The second conductive layer is used as a word line W/L.

The first insulating layer 116 is then formed over the second conductive layer 114 by depositing an oxide film, a nitride film, a combined film of these films, a combined film of polysilicon and oxide film, or a combined film of poly-silicon and nitride film to a thickness of about 3000~5000 Å. The first insulating layer 116 serves to protect the word line in a subsequent SAS etching process.

Figure 14:
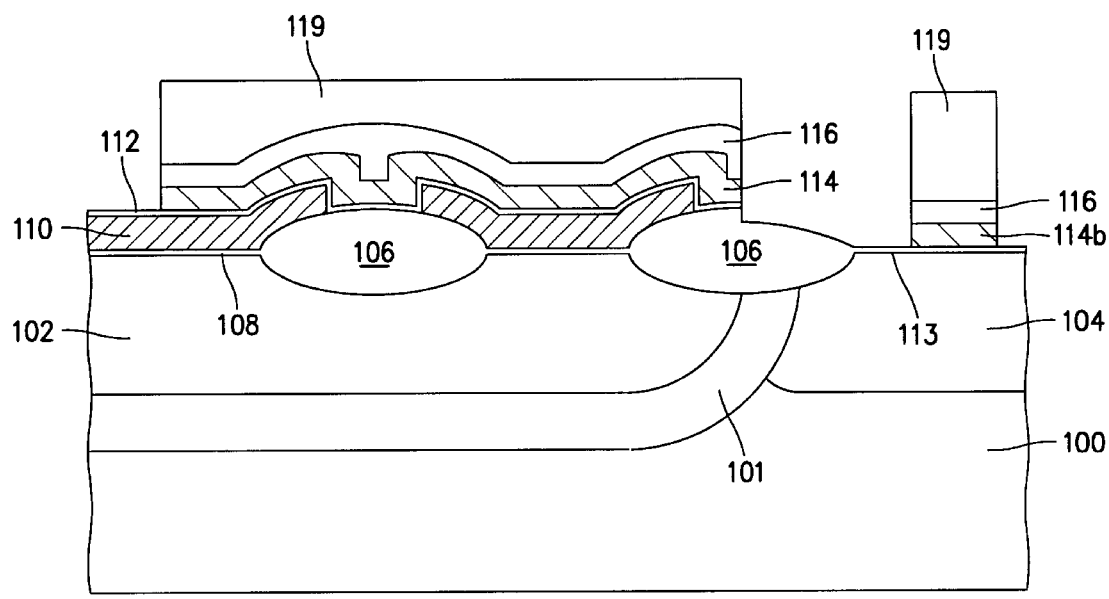

FIG. 14 shows the step of forming a gate pattern of the peripheral circuit region. After forming the first insulating layer 116 as described above, a photoresist pattern 119 for forming the word line pattern of the memory cell array and the gate pattern of the peripheral circuit region is formed by photolithography. Then, the exposed first insulating layer 116 and second conductive layer 114 are etched by using the photoresist pattern 119 as an etching mask. In order to solve the problem that etching gas is not uniformly supplied to the region where patterns are close together due to the height of the photoresist pattern 119, the photoresist pattern 119 may be removed after etching the exposed first insulating layer 116, to etch the second conductive layer 114 by using the first insulating layer 116, which is thinner than the photoresist pattern 119, as a mask. Through this process, a single-layer gate 114$b$ formed of the second conductive layer is formed at the peripheral circuit region.

Figure 15:
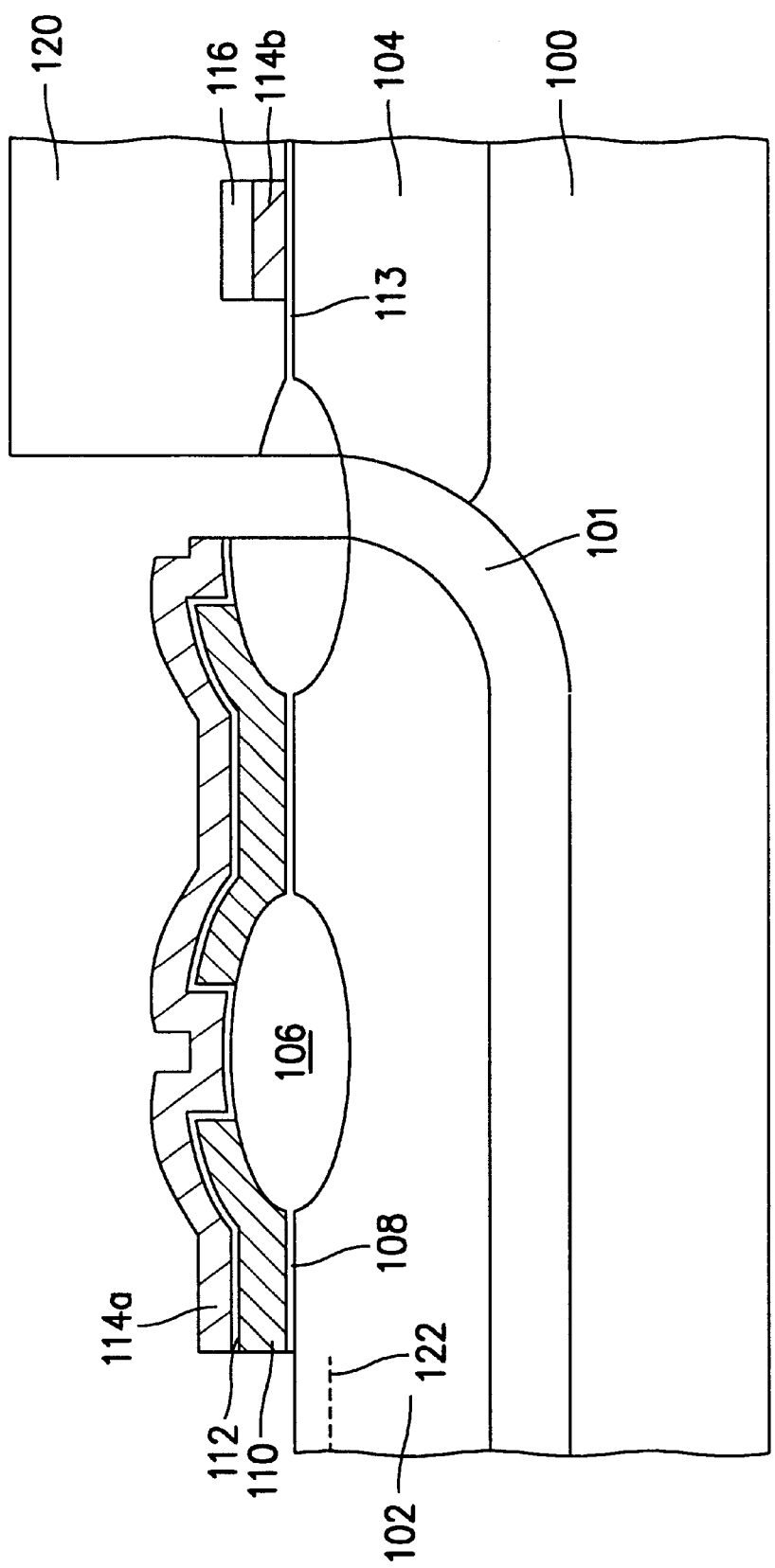

FIG. 15 shows the step of forming a stacked gate of the memory cell array. After forming the single-layer gate 114$b$ at the peripheral circuit region as described above the photoresist pattern 119 is removed. Then, a photoresist pattern 120 is formed by photolithography to mask the peripheral circuit region. The second conductive layer 114, the interpoly dielectric layer 112 and the first conductive layer 110 are then sequentially removed using the exposed first insulating layer 116 in the memory cell array as a mask, thereby forming a stacked gate of the floating gate 110 and control gate 114$a$. In that case, the control gate 114$a$ is connected to that of adjacent cell, thus forming a word line.

Subsequently, a first n$^+$ impurity 122; e.g., arsenic, is ion-implanted at the exposed cell region, preferably with an energy of 70 keV and a dose of 6×10$^{16}$ ion/cm$^2$, by using the photoresist pattern 120 as an ion-implantation mask. In this case, the first n$^+$ impurity 122 is implanted only onto the source/drain regions of the cell because the patterned word line 114$a$ and the field oxide film 106 act as a mask. Thereafter, the exposed field oxide film 106 in the memory cell array is removed by using the photoresist pattern 120 as an etching mask. In this case, all portions of the first insulating layer 116 on the word line 114$a$ are removed or remain with a uniform thickness. All portions of the field oxide film 106 at the region where the word line 114$a$ is not formed in the memory cell array are removed by the above-described process, and a field transistor is not formed at the drain region of the cell. Hence, only the voltage of about 5V applied during the programming operation needs to satisfy the condition for isolation from the adjacent cell, and it is possible to secure sufficient insulating capability regardless of the presence/absence of the field oxide film 106 since the isolation characteristics are related to the n$^+$ diffusion layer distance between cells.

Figure 16:
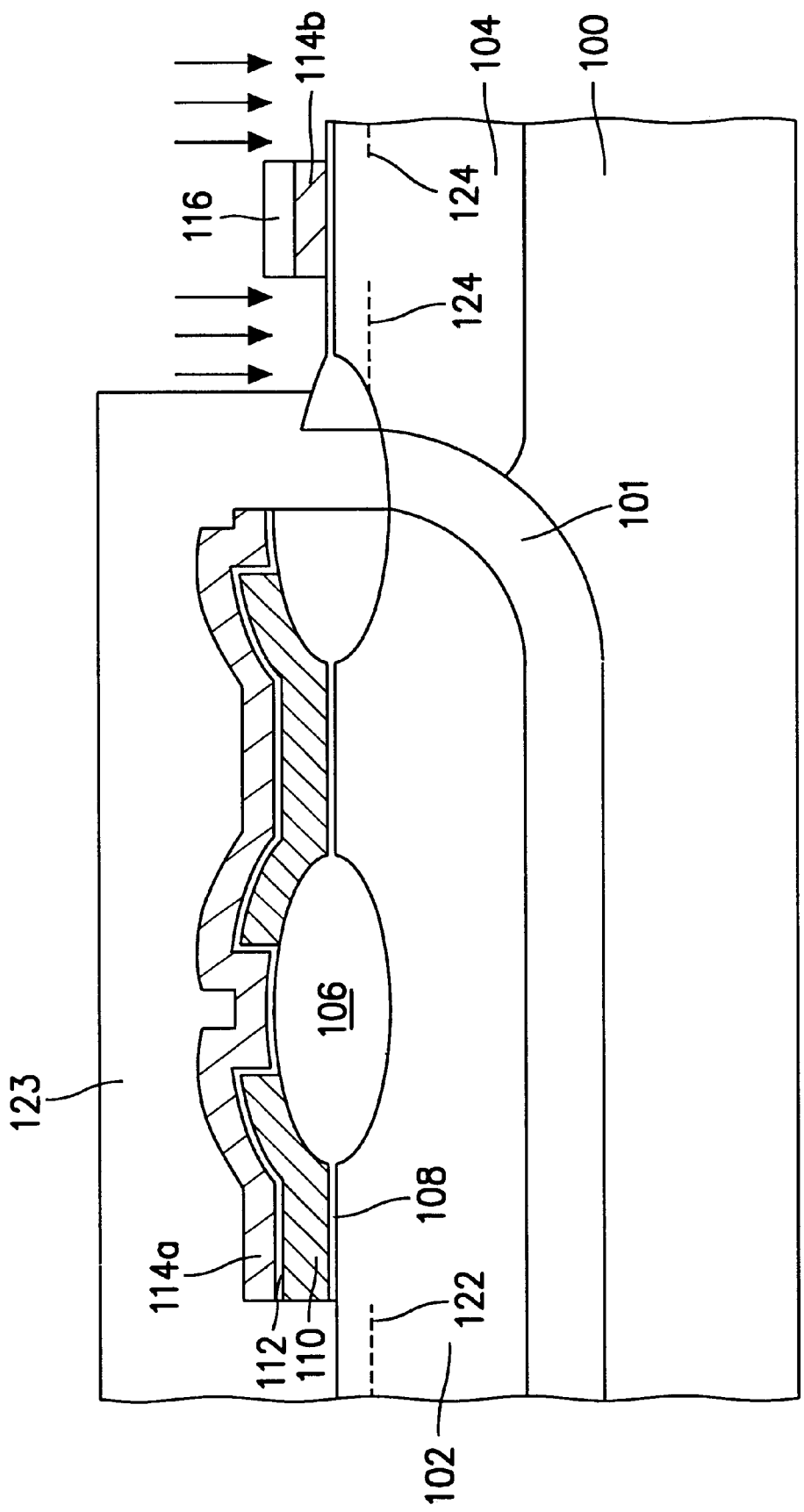

FIG. 16 shows the step of ion-implanting a second n$^+$ impurity 124. After performing the SAS etching process as described above, the photoresist pattern 120 is removed. After forming a photoresist pattern 123 for opening the NMOS transistor region of the peripheral circuit region by a photolithography, a second n$^+$ impurity 124, e.g., arsenic is ion-implanted 125, preferably with an energy of about 70 keV, and at a dose of 6×10$^{15}$ ion/cm$^2$, by using the photoresist pattern 123 as an ion-implantation mask. In this case, the photoresist pattern 123 is formed to open the region connecting to the source regions of adjacent cells exposed by the SAS process, i.e., a common source region, and thus the second n$^+$ impurity 124 is ion-implanted onto the opened common source region.

Then, to form the source region of the cell to be a DD junction structure, which can endure a high voltage of about 12V, a step of opening the source region of the cell as well as the high voltage transistor region of the peripheral circuit region and ion-implanting an n⁻ impurity 127, e.g., phosphorus with an energy of about 50 keV and at a dose of $2\times10^{13}$ ion/cm², onto the opened source region and high voltage transistor region may be added before or after the step of ion-implanting the second n⁺ impurity 124. Furthermore, to prevent the addition of a masking and ion-implantation process for implanting the n impurity, the source region of the cell may be formed only of the n⁺ junction like the drain region, to remove the high voltage path by lowering the voltage applied to the source region to about 5V and applying a negative voltage to the gate during an erasing operation.

Though not shown, after opening a PMOS transistor region of the peripheral circuit region by a photolithography, a p-type impurity, e.g., $BF_2$ is ion-implanted preferably with an energy of about 60 keV and at a dose of $5\times10^{15}$ ion/cm². In the case of ion-implanting an n⁻ impurity for LDD (lightly doped drain) without a mask to form the NMOS transistor of the peripheral circuit region to be an LDD structure, the n⁻ impurity for the LDD structure should be ion-implanted before the SAS process so as not to degrade the isolation capability of the active region exposed by the SAS process.

Figure 17:
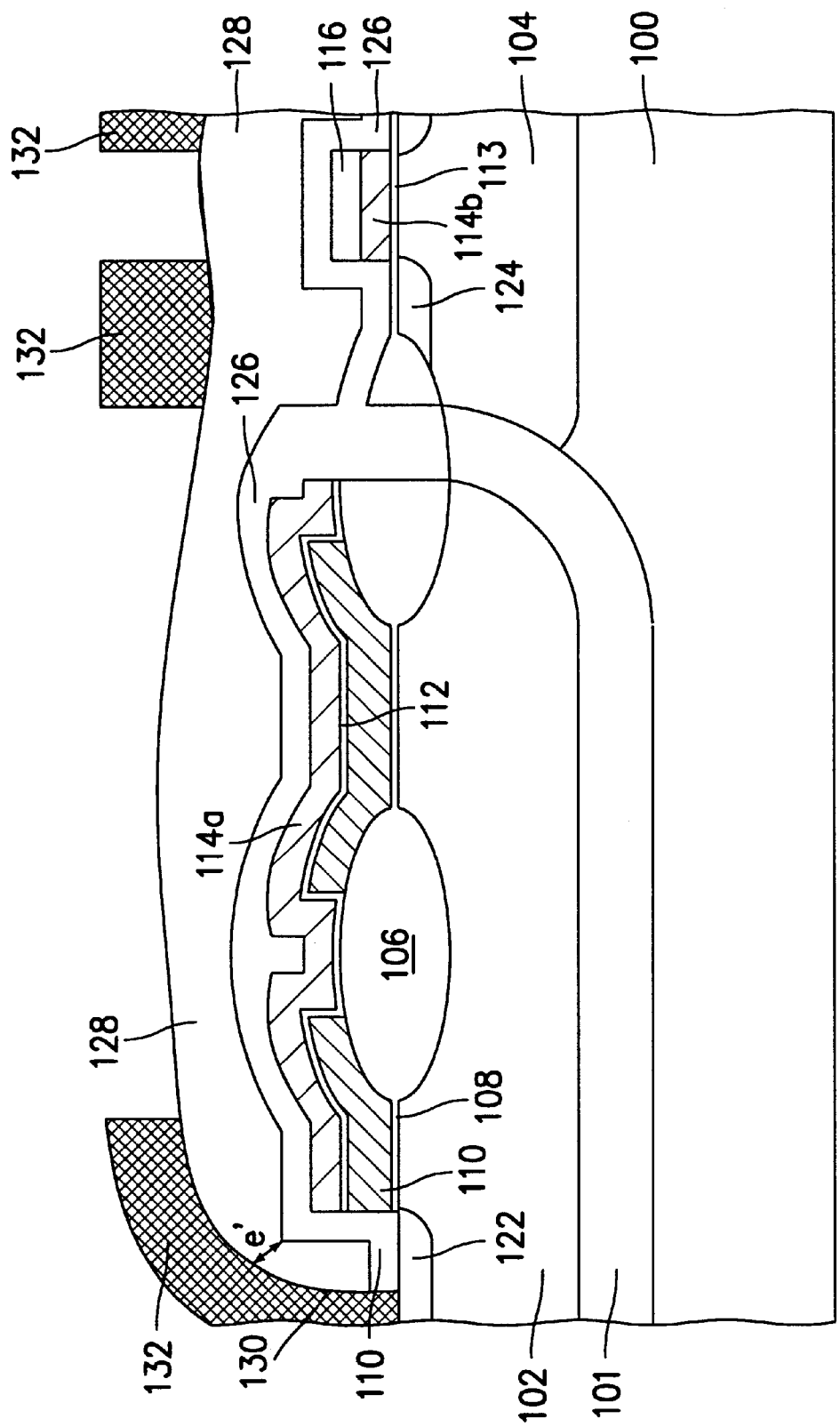

FIG. 17 shows the step of forming a bit line contact hole 131 and a bit line 132. After ion-implanting the second n⁺ impurity 124 as described above, an HTO (high temperature oxidation) layer is deposited on the resultant structure to a thickness of about 1000 Å, to form a second insulating layer 126, and a BPSG (Boro-phosphor silicate Glass) layer is deposited thereon to a thickness of about 5000 Å. Then, the surface of the BPSG layer is planarized by processing a reflow, preferably at the temperature of about 900° C., thus forming a planar layer 128. The first and second n⁺ impurities ion-implanted in the previous step are diffused and activated by the reflow process, thereby forming the source/drain regions 122 of the cell, the source/drain regions 124 of the NMOS transistor of the peripheral circuit region and an n⁺ common source region (not shown) connecting the source regions of adjacent cells in the word line direction.

The planar layer 128 and the second insulating layer 126 deposited over the drain region 122 of the cell are removed by wet and dry etching, thus forming the bit line contact 130. In this case, though not shown, the planar layer 128 and the second insulating layer 126 deposited on the common source region every 16~32 bits are also etched, thus forming a source line contact hole. The reason why wet etching is used when forming the contacts is to improve a contact hole profile.

Thereafter, a metal layer, e.g., a silicide layer, a polycide layer, or an aluminum layer, is deposited over the resultant structure having the contact holes and is patterned by a photolithography. As a result, a bit line that is electrically connected to the drain region 122 of the cell via the bit line contact hole 131 and a source line (not shown) that is electrically connected to the common source region of the cell via the source line contact hole are formed.

After adding a process of forming a metal contact hole and a metal layer if multilayer wiring is required, a passivation layer (not shown) is preferably formed over the resultant structure, to complete the NOR flash memory device.

The difference between a conventional SAS process and the SAS process of the present invention will be described in detail below with reference to FIGS. 18A to 19B, by way of example.

Figure 1:
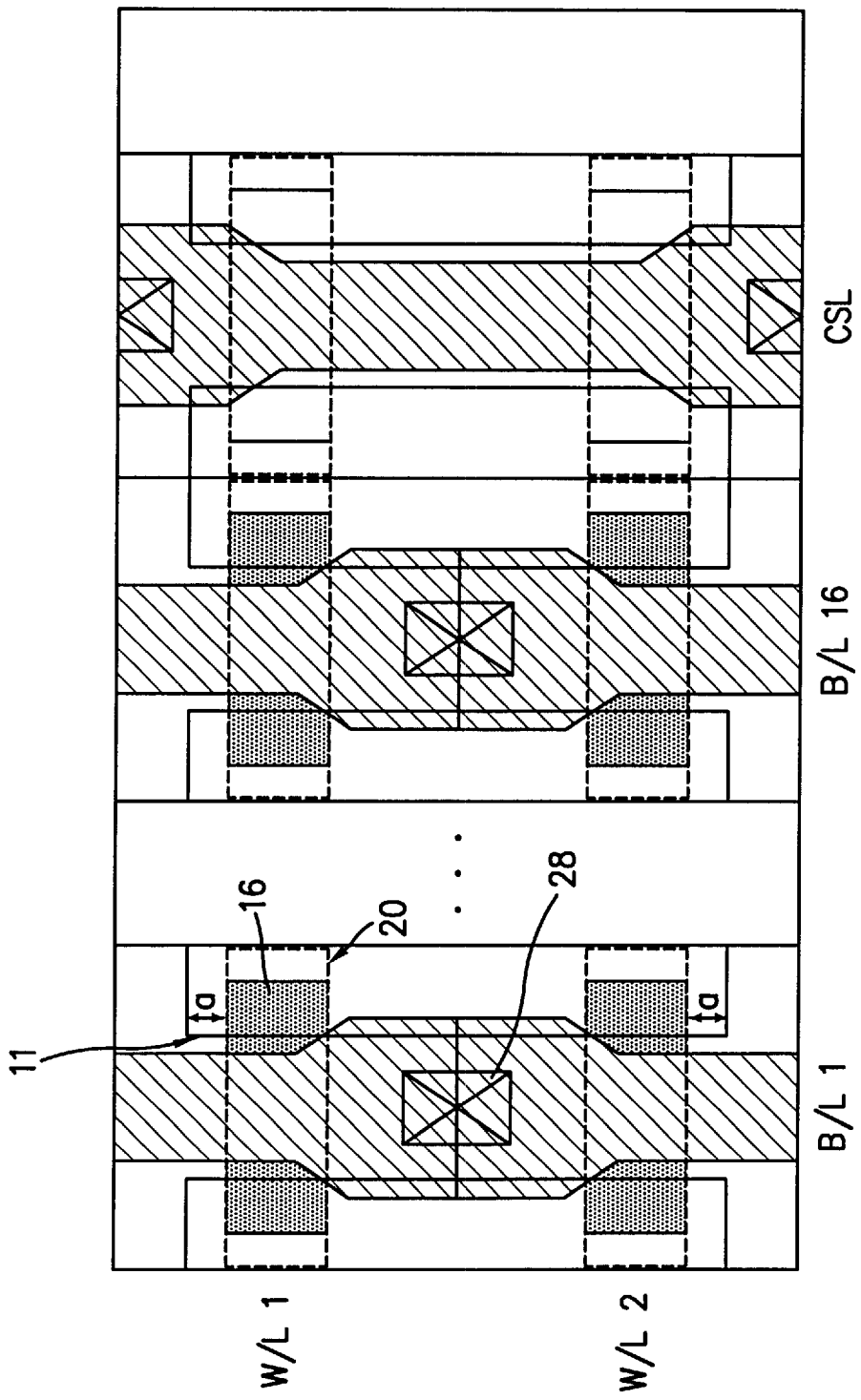
FIG. 1 is a partial layout diagram of a memory cell array in a conventional NOR nonvolatile memory device.
Figure 2:
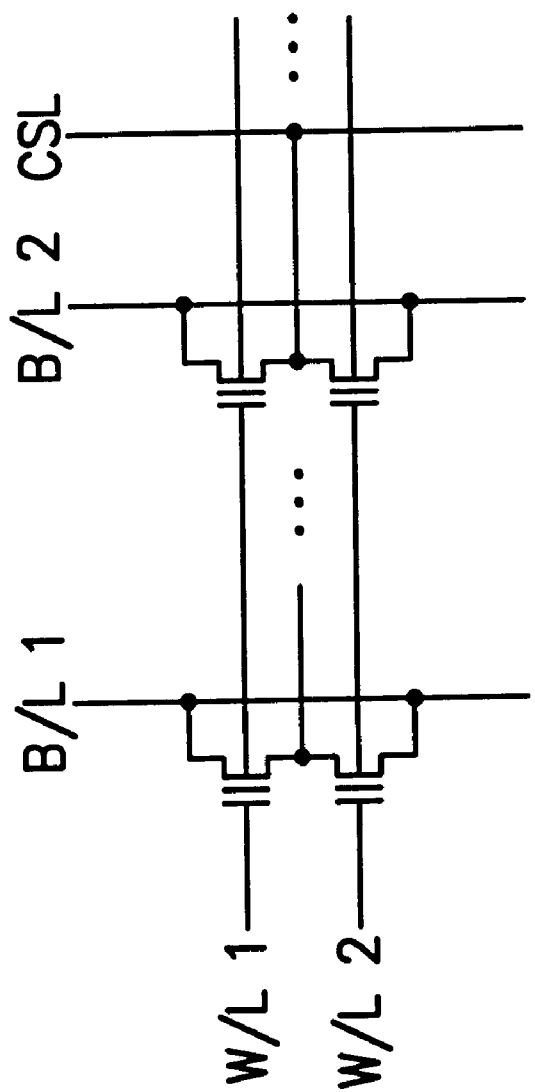
FIG. 2 is an equivalent circuit diagram of the cell array of FIG. 1.
Figure 3:
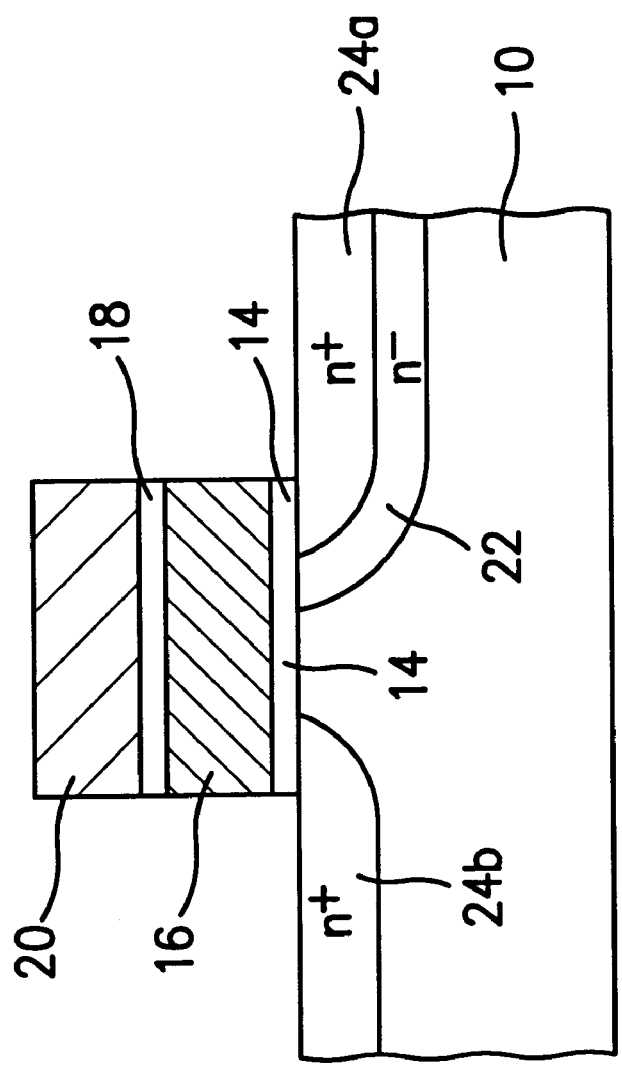
FIG. 3 is a cross sectional view of a unit cell in the cell array of FIG. 1.
Figure 4:
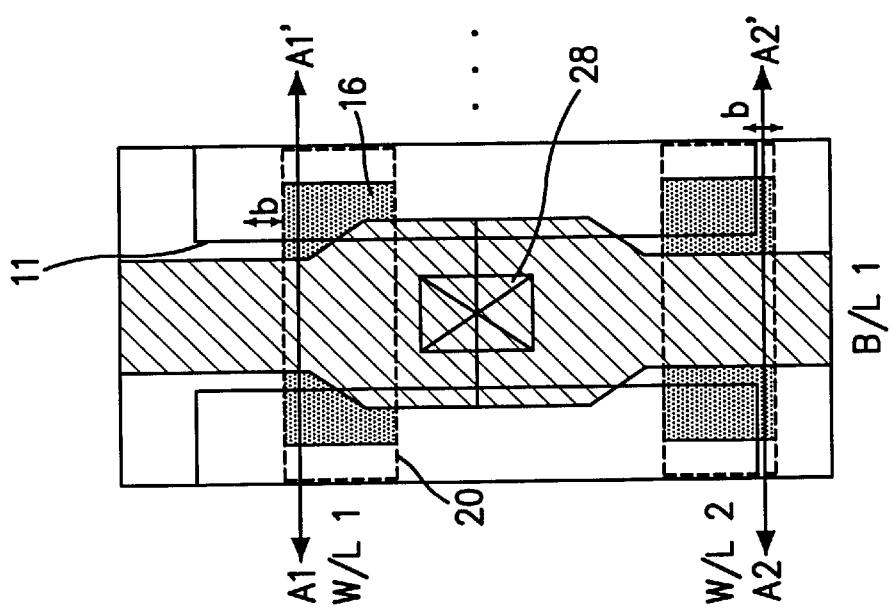
FIG. 4 is a layout diagram showing the misalignment between an active source region and a word line in the cell array of FIG. 1.
Figure 5A:
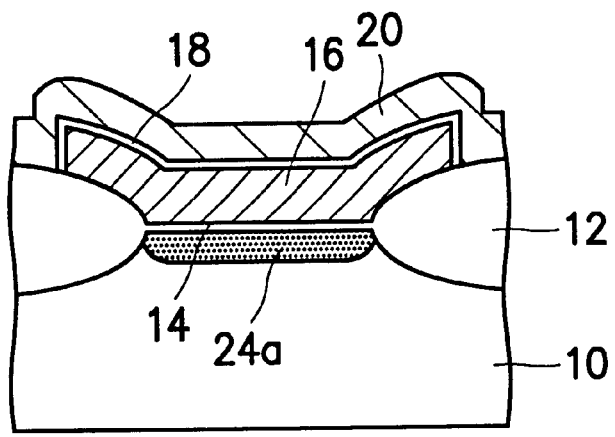
FIGS. 5A and 5B are sectional views of the cell array, taken along lines A1–A1' and A2–A2', respectively of FIG. 4.
Figure 5B:
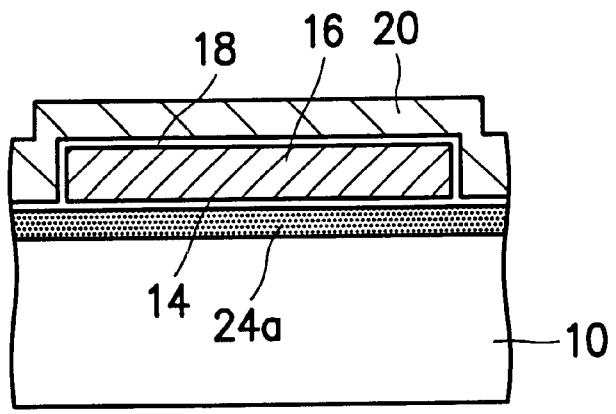
Figure 6:
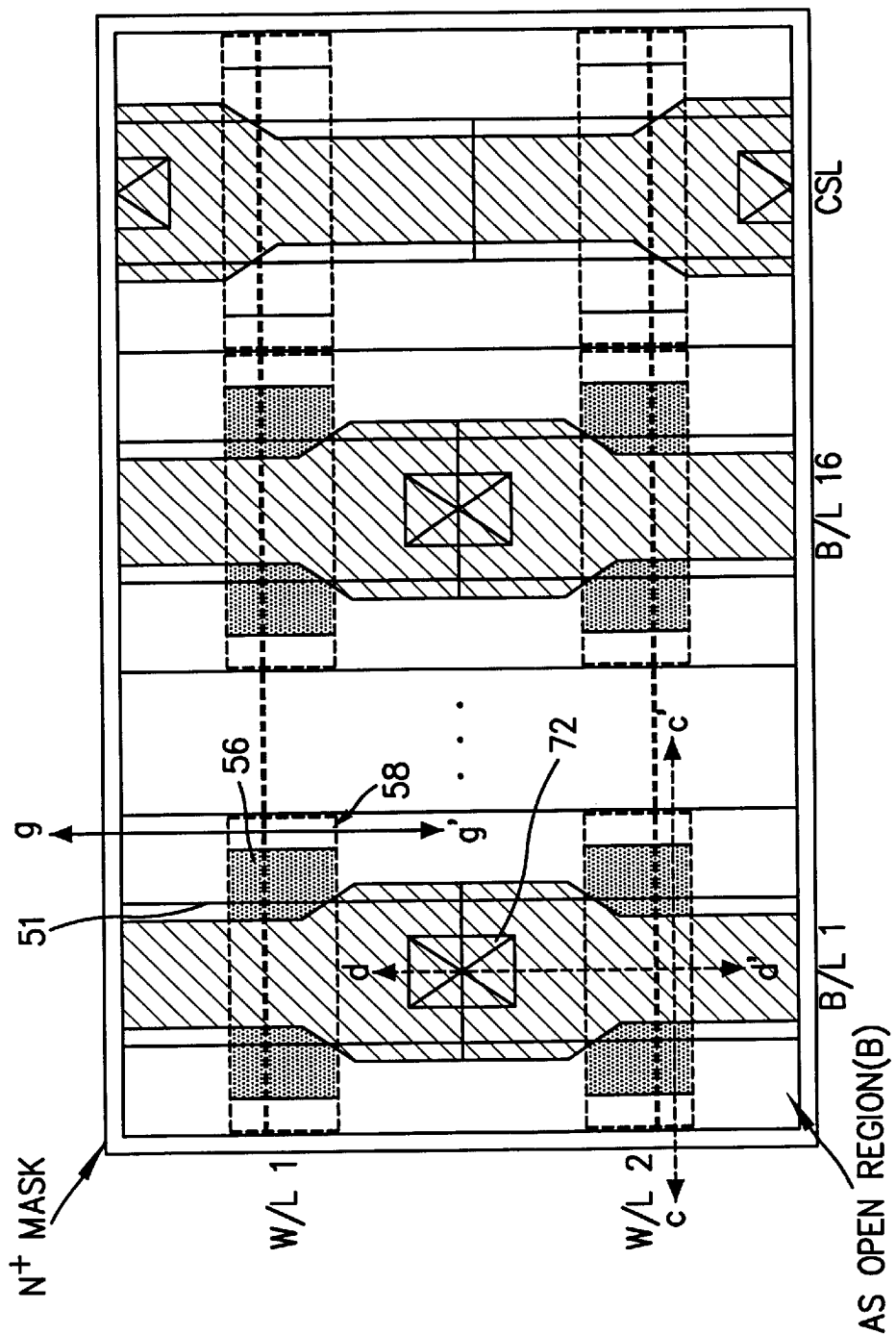
FIG. 6 is a partial layout diagram of a memory cell array in a NOR nonvolatile memory device according to another conventional method.
Figure 7A:
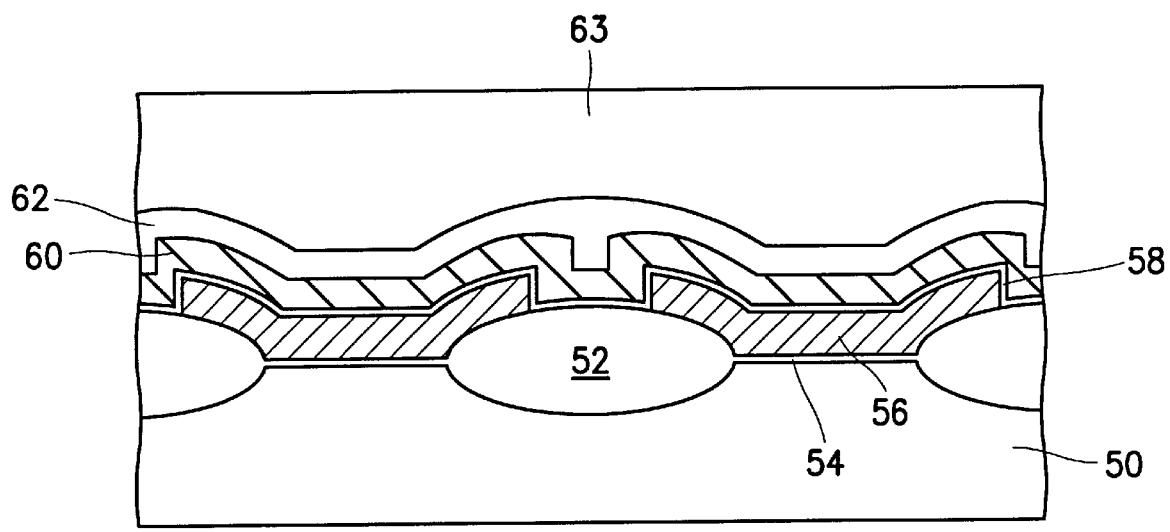
FIGS. 7A, 7B, 8A and 8B are sectional views for explaining a method for manufacturing the NOR nonvolatile memory device of FIG. 6.
Figure 7B:
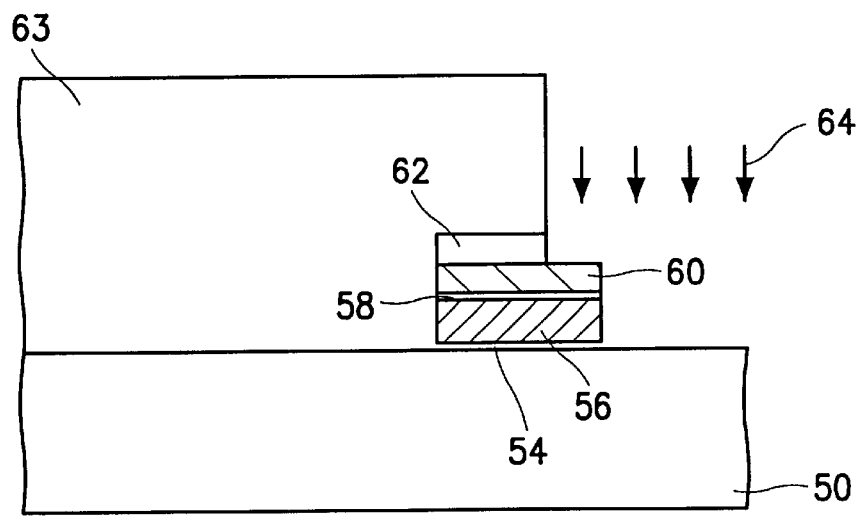
Figure 8A:
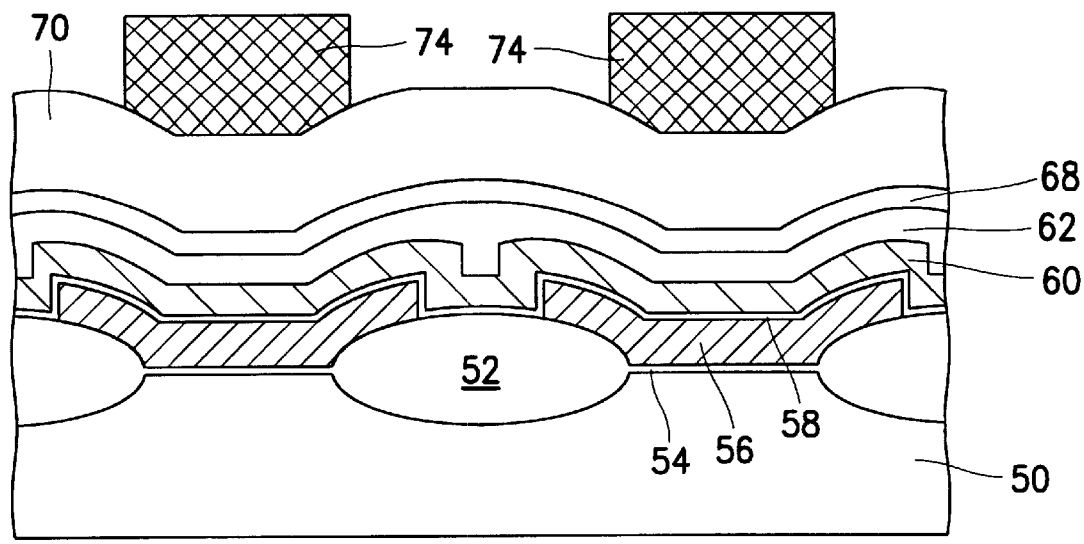
Figure 8B:
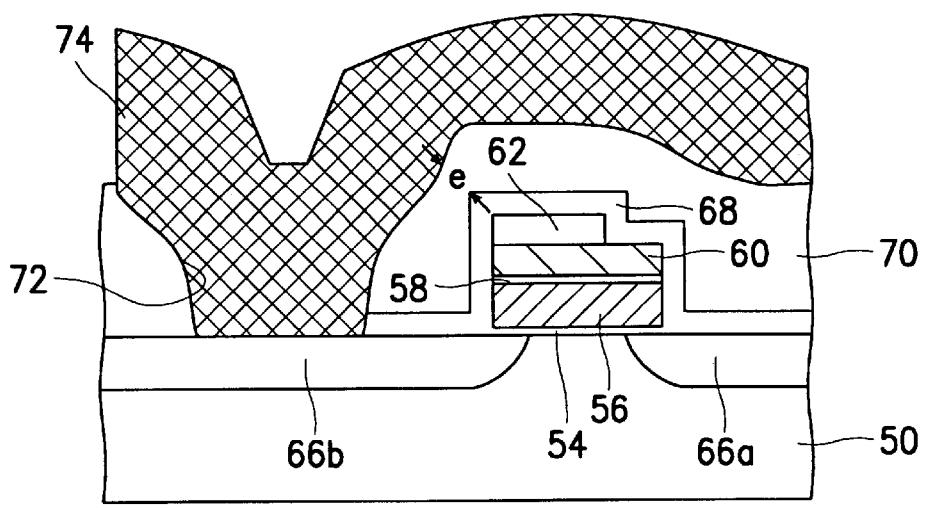
Figure 18A:
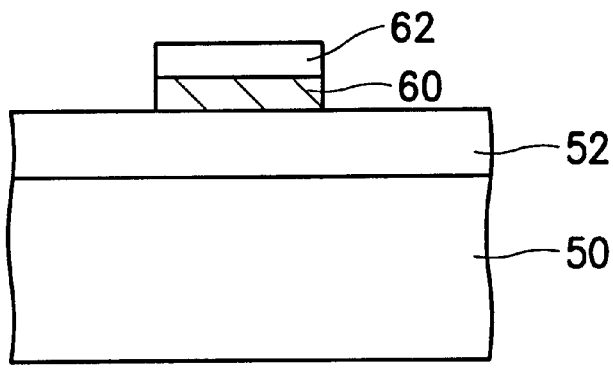
FIGS. 18A and 18B are sectional views showing the structure of the conventional nonvolatile memory device of FIG. 6 before and after the SAS process, respectively.
Figure 18B:
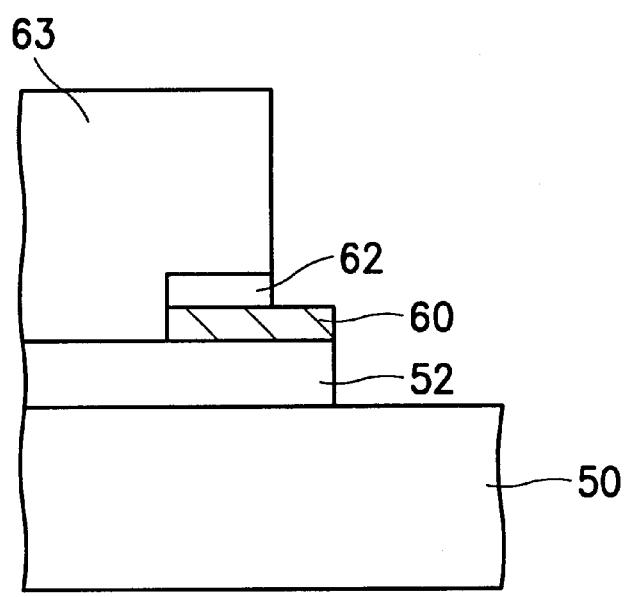
Figure 19A:
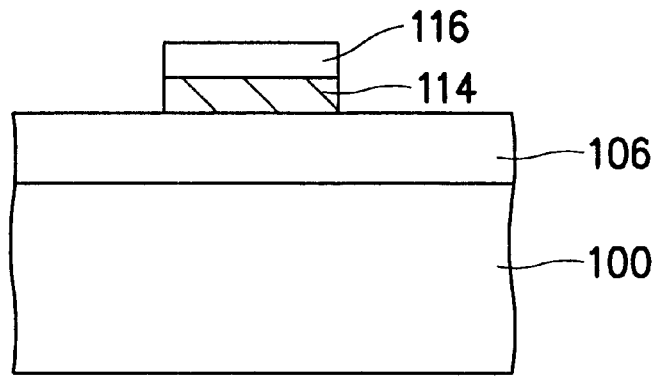
FIGS. 19A and 19B are sectional views showing the structure of the nonvolatile memory device of FIG. 9 before and after the SAS process, respectively.
Figure 19B:
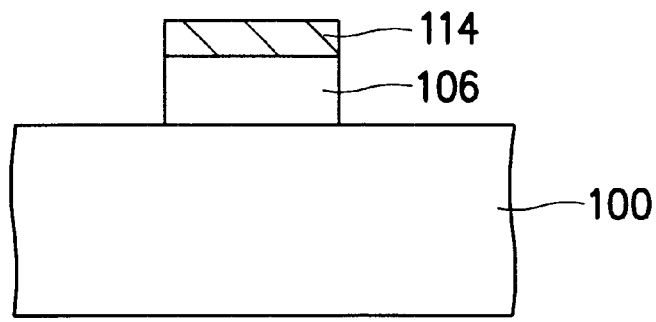

FIGS. 18A and 18B are sectional views showing the structure of the conventional nonvolatile memory device of FIG. 6 before and after the SAS process, respectively, and FIGS. 19A and 19B are sectional views showing the structure of the nonvolatile memory device of the present invention of FIG. 9 before and after the SAS process, respectively.

According to the conventional SAS process as shown in FIGS. 18A and 18B, after patterning the second polysilicon layer 60 and the oxide film 62 by the word line pattern, the photoresist pattern 63 for the SAS process is formed and the exposed field oxide film 52 is etched by using the photoresist pattern 63 as an etching mask. In this case, all portions of the oxide film 62 at the region exposed by the SAS process are removed, while portions of the oxide film 62 and portions of the oxide film 52 remains.

On the contrary, according to the SAS process of the present invention as shown in FIGS. 19A and 19B, after forming the word line pattern of the memory cell array and the gate pattern of the peripheral circuit region by etching the second conductive layer 114, the photoresist pattern (not shown) is formed by a photolithography to mask the peripheral circuit region. Subsequently, the interpoly dielectric layer and the first conductive layer (not shown) of the memory cell array are etched by using the word line pattern and the photoresist pattern, to form the stacked gate and then the exposed all field oxide film 106 in the memory cell array is etched by using the stacked gate, i.e., the word line and the photoresist pattern. With this process, the common source region is formed and field oxide film 106 formed between the drain regions of adjacent cells is removed to thereby expose the substrate, and the field oxide film 106 having side edges formed in a self-alignment manner to the side edges of the second conductive layer is formed under the second conductive layer, i.e., the word line. Hence, the first insulating layer 116 is etched together when etching the exposed field oxide film 106 or remains on the word line 114 while maintaining a uniform thickness. Therefore, it is possible to secure sufficient process margin "e" in the bit line contact region, i.e., a proper distance "e" between the bit line 132 and the second insulating layer 126, as shown in FIG. 17.

As described above, the present invention does not need an additional mask for the SAS process because the SAS process is performed by using the mask for forming the stacked gate of the memory cell array. Furthermore, it is possible to secure sufficient process margin in the bit line contact region, since all portions of the first insulating layer on the word line are removed or remain with maintaining a uniform thickness after the SAS etching process.

While this invention has been described in connection with what is presently considered to be the most practical and preferred embodiment, it is to be understood that the invention is not limited to the disclosed embodiment, but, on the contrary, it is intended to cover various modifications within the spirit and scope of the appended claims.

What is claimed is:

1. A method for manufacturing a nonvolatile memory device comprising a memory cell array having a plurality of cells, the method comprising:

(a) forming a field oxide film over a semiconductor substrate to define an active region of the substrate;

(b) sequentially forming a tunnel oxide film, a first conductive layer, an interpoly dielectric layer, a second conductive layer, and a first insulating layer over the substrate;

(c) forming a stacked gate of the first and second conductive layers over the active region;

(d) forming source/drain regions of a first concentration by ion-implanting a first impurity in a portion of the active region exposed by the stacked gate;

(e) removing an exposed portion of the field oxide film using the second conductive layer as an etching mask; and (f) exposing the source region of each cell and a portion of the second conductive layer, and ion-implanting second impurity using the exposed second conductive layer as a mask.

2. A method for manufacturing a nonvolatile memory device, as recited in claim 1, wherein the second conducting layer is formed as a line.

3. A method for manufacturing a nonvolatile memory device, as recited in claim 1, wherein steps (c), (d) and (e) are processed using a single photo mask.

4. A method for manufacturing a nonvolatile memory device, as recited in claim 1, wherein all of the first insulating layer is etched in step (e).

5. A method for manufacturing a nonvolatile memory device, as recited in claim 1, wherein the first insulating layer remains over the whole of the second conductive layer and maintains a uniform thickness after step (e).

6. A method for manufacturing a nonvolatile memory device comprising a memory cell array having a plurality of cells, each cell including a stacked gate structure having a first conductive layer and a second conductive layer, and a peripheral circuit region for driving the cells, the method comprising:

(a) forming a field oxide film over a semiconductor substrate to define an active region of the substrate;

(b) sequentially forming a tunnel oxide film, the first conductive layer, an interpoly dielectric layer, the second conductive layer and a first insulating layer over the substrate;

(c) forming a single-layer gate comprising the second conductive layer over the active region of the peripheral circuit region;

(d) forming a stacked gate of the first and second conductive layers over the active region of the memory cell array;

(e) forming source/drain regions of the cell at a first concentration by ion-implanting a first impurity in a portion of the active region of the memory cell array that is exposed by the stacked gate;

(f) removing an exposed portion of the field oxide film using the second conductive layer as an etching mask; and (g) exposing the source region of each cell in the memory cell array and an active region of the peripheral circuit region and ion-implanting a second impurity in the exposed source regions.

7. A method for manufacturing a nonvolatile memory device, as recited in claim 6, wherein the second conducting layer is formed as a line.

8. A method for manufacturing a nonvolatile memory device, as recited in claim 6, wherein steps (d), (e) and (f) are processed using a single photo mask.

9. A method for manufacturing a nonvolatile memory device, as recited in claim 6, wherein step (b) further comprises isolating the first conductive layer of each cell by exposing a portion of the field oxide film between the active regions of the memory cell array and etching the first conductive layer, the isolating being performed before forming the interpoly dielectric layer over the first conductive layer.

10. A method for manufacturing a nonvolatile memory device, as recited in claim 6, wherein step (b) further comprises removing the interpoly dielectric layer and the first conductive layer in the peripheral circuit region; and forming a gate oxide film over the active region of the peripheral circuit region, before forming the second conductive layer over the interpoly dielectric layer.

11. A method for manufacturing a nonvolatile memory device, as recited in claim 6, wherein all portions of the first insulating layer are etched in step (f).

12. A method for manufacturing a nonvolatile memory device, as recited in claim 6, wherein the first insulating layer remains over the whole of the second conductive layer and maintains a uniform thickness after step (f).

13. A method for manufacturing a nonvolatile memory device, as recited in claim 6, further comprising forming an impurity region of a second concentration lower than the first concentration by exposing the source region of the cell and ion-implanting a third impurity into the exposed source region of the cell.

14. A method for manufacturing a nonvolatile memory device, as recited in claim 13, wherein a region where a high voltage device is to be formed in the peripheral circuit region is also exposed when exposing the source region of the cell.

* * * * *